(12) United States Patent
Yoshida et al.

(10) Patent No.: US 9,748,080 B2
(45) Date of Patent: Aug. 29, 2017

(54) CU—GA ALLOY SPUTTERING TARGET AND METHOD FOR PRODUCING SAME

(71) Applicant: MITSUBISHI MATERIALS CORPORATION, Tokyo (JP)

(72) Inventors: Yuuki Yoshida, Naka-gun (JP); Kouichi Ishiyama, Saitama (JP); Satoru Mori, Okegawa (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 15/113,210

(22) PCT Filed: Nov. 18, 2014

(86) PCT No.: PCT/JP2014/080465
§ 371 (c)(1),
(2) Date: Jul. 21, 2016

(87) PCT Pub. No.: WO2015/114914
PCT Pub. Date: Aug. 6, 2015

(65) Prior Publication Data
US 2017/0011895 A1    Jan. 12, 2017

(30) Foreign Application Priority Data

Jan. 28, 2014 (JP) ................. 2014-013184

(51) Int. Cl.
| | |
|---|---|
| *C23C 14/34* | (2006.01) |
| *H01J 37/34* | (2006.01) |
| *B22F 3/10* | (2006.01) |
| *C22C 9/00* | (2006.01) |
| *B22F 1/00* | (2006.01) |
| *C22C 1/04* | (2006.01) |

(52) U.S. Cl.
CPC ........ *H01J 37/3429* (2013.01); *B22F 1/0003* (2013.01); *B22F 1/0011* (2013.01);
(Continued)

(58) Field of Classification Search
CPC ....... H01J 37/3429; B22F 1/0003; B22F 3/10; B22F 3/24; C22C 1/0425; C22C 1/0491; C23C 14/3414
See application file for complete search history.

(56) References Cited

U.S. PATENT DOCUMENTS 7,935,558 B1    5/2011  Juliano et al.
2014/0034491 A1    2/2014  Zhang et al.

FOREIGN PATENT DOCUMENTS

CN    102046836 A    5/2011
CN    102362002 A    2/2012
(Continued)

OTHER PUBLICATIONS

Translation to Sato (JP 2013-142175) published Jul. 2013.*
(Continued)

*Primary Examiner* — John Brayton
(74) *Attorney, Agent, or Firm* — Locke Lord LLP (57) ABSTRACT

According to the present invention, a Cu—Ga alloy sputtering target which is a sintered body has a composition with 29.5 atom % to 43.0 atom % of Ga and a balance of Cu and inevitable impurities. A Cu—Ga alloy crystal particle in the sintered body has a structure in which γ phase particles are dispersed in a $\gamma_1$-phase crystal particle. A method for producing the sputtering target includes a step of performing normal pressure sintering by heating a molded body formed of a powder mixture of a pure Cu powder and a Cu—Ga alloy powder in a reducing atmosphere, and a step of cooling the obtained sintered body at a cooling rate of 0.1° C./min to 1.0° C./min, at a temperature having a range of 450° C. to 650° C.

20 Claims, 3 Drawing Sheets

(51) Int. Cl.
*B22F 3/24* (2006.01)
*H01L 31/0749* (2012.01)

(52) U.S. Cl.
CPC .............. *B22F 3/10* (2013.01); *B22F 3/24* (2013.01); *C22C 1/0425* (2013.01); *C22C 1/0491* (2013.01); *C22C 9/00* (2013.01); *C23C 14/3414* (2013.01); *B22F 2201/01* (2013.01); *B22F 2302/45* (2013.01); *B22F 2998/10* (2013.01); *H01L 31/0749* (2013.01); *Y02E 10/541* (2013.01)

(56) References Cited

FOREIGN PATENT DOCUMENTS

| | | |
|---|---|---|
| CN | 103534381 A | 1/2014 |
| JP | 2000-073163 | 3/2000 |
| JP | 2010280944 A * | 12/2010 ............... C22C 9/00 |
| JP | 2012-017481 A | 1/2012 |
| JP | 2012-193423 A | 10/2012 |
| JP | 2012-201948 A | 10/2012 |
| JP | 2013142175 A * | 7/2013 |
| WO | WO-2011/010529 A1 | 1/2011 |
| WO | WO-2012/147985 A1 | 11/2012 |

OTHER PUBLICATIONS

Shogo Ishizuka et al., "Recent Developments in Chalcopyrite Solar Cell and Module Technologies," Journal of the Vacuum Society of Japan, vol. 53, No. 1 2010 , pp. 25-29 and Partial translation thereof.
International Search Report dated Feb. 10, 2015, issued for PCT/JP2014/080465 and English translation thereof.
Office Action mailed Nov. 28, 2016, issued for the Chinese patent application No. 201480060592.4 and English translation thereof.

* cited by examiner

CU—GA ALLOY SPUTTERING TARGET AND METHOD FOR PRODUCING SAME

TECHNICAL FIELD

The present invention relates to a Cu—Ga alloy sputtering target used in the formation of a Cu—In—Ga—Se compound film (abbreviated as a CIGS film below) for forming a light-absorbing layer of a CIGS thin-film solar cell, and a method for producing the same.

Priority is claimed on Japanese Patent Application No. 2014-013184, filed Jan. 28, 2014, the content of which is incorporated herein by reference.

BACKGROUND ART

In recent years, a thin-film solar cell produced using a chalcopyrite compound semiconductor has been put into practical use. The thin-film solar cell produced using a compound semiconductor has a base structure in which layers are formed on a soda-lime glass substrate in an order of a Mo electrode layer, a light-absorbing layer, a buffer layer, and a transparent electrode layer. The Mo electrode layer serves as a positive electrode. The light-absorbing layer is made of a CIGS film. The buffer layer is made of ZnS, CdS, or the like. The transparent electrode layer serves as a negative electrode.

As a method for forming a light-absorbing layer, for example, a method of forming a film by using a multi-component deposition method is known. In a light-absorbing layer obtained by using this method, high-energy conversion efficiency is obtained, but deposition is performed from a point source. Thus, when a film is formed on a substrate having a large area, uniformity of distribution in film thickness is easily degraded. For this reason, a method for forming a light-absorbing layer using a sputtering method has been proposed.

As the method for forming a light-absorbing layer using a sputtering method, firstly, a method (selenidation method) is employed in which an In film is formed by sputtering and by using an In target, a Cu—Ga binary alloy film is formed on the In film through sputtering using a Cu—Ga binary alloy sputtering target, and then a laminate precursor film made of the obtained In film and Cu—Ga binary alloy film is thermally treated in a Se atmosphere, thereby forming a CIGS film.

A technology which will be described below has been proposed on a background of the above technologies. In the technology, a laminate precursor film of the Cu—Ga alloy film and the In film is produced by using a sputtering method which is performed in order of a Cu—Ga alloy layer having a high Ga content, a Cu—Ga alloy layer having a low Ga content, and an In layer from a metal backside electrode layer side. The produced laminate precursor film is thermally treated in a selenium atmosphere and/or a sulfur atmosphere, and thereby the concentration gradient of Ga in the thin film light-absorbing layer is gradually (in stages) changed from an interface layer (buffer layer) side to the metal backside electrode layer side. Thus, it is possible to realize a thin-film solar cell having a high open circuit voltage, and to prevent separation of the thin film light-absorbing layer from other layers. In this case, the Ga content of the Cu—Ga alloy sputtering target being set to be 1 to 40 atom % is proposed.

As such a Cu—Ga alloy sputtering target for forming a Cu—Ga alloy layer, a Cu—Ga alloy sintered body sputtering target which is sintered by performing hot pressing on a Cu—Ga powder mixture produced by a water atomizing device has been proposed (for example, see PTL 1). The Cu—Ga alloy sintered body sputtering target is formed of a single composition. Intensity of peaks other than a main peak in a graph obtained by X-ray diffraction of the Cu—Ga alloy is equal to or 5% less than that of the main peak. An average crystal particle diameter thereof is 5 µm to 30 µm. The oxygen content obtained in the target is 350 ppm to 400 ppm.

In order to improve power generation efficiency of a light-absorbing layer formed from a CIGS film, it is effective that Na be added to the light-absorbing layer through diffusion from an alkaline glass substrate (for example, see NPL 1). However, in a case of a flexible CIGS solar cell in which a polymer film or the like is used as a base instead of the alkaline glass, the CIGS solar cell does not include the alkaline glass substrate, and thus it is inconvenient in that providing a supply source of Na is not possible. In NPL 1, regarding the addition of Na, a method of forming a soda-lime glass between a Mo electrode layer and a substrate is proposed. However, in a case where film formation is performed on the soda-lime glass, producing processes are increased and productivity is degraded. Thus, a technology in which a sodium compound is added to a Cu—In—Ga (referred to as CIG below) precursor film, thereby a supply of Na to the light-absorbing layer is ensured has been proposed (for example, see PTL 2).

CITATION LIST

Patent Literature

[PTL 1] PCT International Publication No. WO2011/010529
[PTL 2] Specification of U.S. Pat. No. 7,935,558

Non-Patent Literature

[NPL 1] ISHIZUKA et al., "Recent Developments in Chalcopyrite Thin Film Solar Cell and Module Technologies", Journal of the Vacuum Society of Japan, Vol 53, 2010 p. 25

DISCLOSURE OF INVENTION

Technical Problem

The above-described technologies in the related art have the following problems.

The Cu—Ga alloy sputtering target disclosed in PTL 1 is a sintered body manufactured by hot pressing. Cu—Ga alloy particles in the sintered body actually have a γ phase or has a structure configured so as to cause the major phase to be the γ phase. That is, it is known that the Cu—Ga alloy sputtering target has a single phase structure configured from the γ phase which has relatively fragile properties. However, if a configuration by using the γ phase is made, there is a problem in that processability is not only poor, but also particles are easily generated when sputtering is performed, and thus abnormal discharges is increased.

In the above-proposed technology, the Cu—Ga alloy sputtering target is manufactured by hot pressing, and thus the oxygen content is reduced and the abnormal discharge in sputtering is reduced. However, from a viewpoint of producing a CIGS thin-film solar cell, a sputtering target having a smaller oxygen content is desired. As a method of obtaining a sputtering target with a small oxygen content in this manner, a dissolution method is provided. According to the dissolution method, it is possible to produce a Cu—Ga alloy sputtering target which has an oxygen content significantly reduced to 40 ppm to 50 ppm. However, in the sputtering target, the oxygen content is significantly reduced, but the average particle diameter is significantly increased so as to be 830 μm to 1100 μm. Thus, it is inconvenient that the abnormal discharge is increased.

In a case of a CIG sputtering target by using the above-proposed producing method, there are problems in that a nonconductive sodium compound is not enabled to be appropriately mixed into a CIG sputtering target having a metal matrix, abnormal discharge occurs easily during sputtering, and stable formation of a film is difficult.

Considering the above-described problems, the present invention relates to a sputtering target of a Cu—Ga alloy sintered body which has a Ga component having a high concentration. An object of the present invention is to provide a Cu—Ga alloy sputtering target in which generation of particles can be reduced, the oxygen content can be further reduced, and the abnormal discharge is further suppressed if a high concentration of Na is contained in the Cu—Ga alloy sputtering target, and to provide a method for producing the same.

Solution to Problem

The present invention includes the following aspects in order to solve the above-described problems.

(1) According to the present invention, a Cu—Ga alloy sputtering target is a sintered body which has a composition with 29.5 atom % to 43.0 atom % of Ga and a balance of Cu and inevitable impurities. A Cu—Ga alloy crystal particle in the sintered body has a structure in which γ phase particles are dispersed in a $\gamma_1$-phase crystal particle.

(2) In the Cu—Ga alloy sputtering target of (1), the average number of the γ phase particles in one $\gamma_1$ crystal particle is 6 to 36, and the average particle diameter of $\gamma_1$ phase particles is 15.0 μm to 75.0 μm.

(3) Tn the Cu—Ga alloy sputtering target of (1) or (2), the amount of oxygen in the sintered body is equal to or less than 200 mass ppm.

(4) In the Cu—Ga alloy sputtering target of any one of (1) to (3), the sintered body further contains 0.05 atom % to 10.0 atom % of Na, and a Na compound phase is dispersed in the sintered body.

(5) In the Cu—Ga alloy sputtering target of (4), the Na compound phase is formed of at least one of NaF, $Na_2S$, $Na_2Se$, and $Na_3AlF_6$.

(6) According to the present invention, a method of producing a Cu—Ga alloy sputtering target is the Cu—Ga alloy sputtering target of any one of (1) to (3). The method includes a step of performing normal pressure sintering by heating a molded body formed of a powder mixture of a pure Cu powder and a Cu—Ga alloy powder in a reducing atmosphere, and a step of cooling the obtained sintered body at a cooling rate of 0.1° C./min to 1.0° C./min, at a temperature having a range of 450° C. to 650° C.

(7) According to the present invention, a method of producing a Cu—Ga alloy sputtering target is the Cu—Ga alloy sputtering target of (4) or (5). The method includes a step of performing normal pressure sintering by heating a molded body formed of a powder mixture of a pure Cu powder, a Cu—Ga alloy powder, and a Na compound in a reducing atmosphere, and a step of cooling the obtained sintered body at a cooling rate of 0.1° C./min to 1.0° C./min, at a temperature having a range of 450° C. to 650° C.

Advantageous Effects of Invention

As described above, the Cu—Ga alloy sputtering target according to the present invention is a Cu—Ga alloy sintered body which contains a Ga component which has a high concentration, that is, 29.5 atom % to 43.0 atom % of Ga. A Cu—Ga alloy crystal particle in the sintered body has a structure in which γ phase particles are dispersed in a $\gamma_1$-phase crystal particle. Particularly, the average number of the γ phase particles is 6 to 36, and the average particle diameter of $\gamma_1$ phase crystal particles is 15.0 μm to 75.0 μm. Since fine γ phase particles of the Cu—Ga alloy are dispersed in a $\gamma_1$-phase crystal particle of the Cu—Ga alloy, the parent phase in the Cu—Ga alloy sputtering target is configured by $\gamma_1$-phase crystal particles. Fine γ phase particles are dispersed in the parent phase, and thus it is possible to improve the fragility of the target and to reduce the generation of particles during sputtering. Further, the sintered body also contains 0.05 atom % to 10.0 atom % of Na, and a Na compound (at least one of NaF, $Na_2S$, $Na_2Se$, and $Na_3AlF_6$) phase is dispersed in the sintered body. Thus, according to the Cu—Ga alloy sputtering target of the present invention, it is possible to improve the fragility of the Cu—Ga alloy sputtering target, to reduce generation of particles during sputtering, and to further reduce the oxygen content of the target. In addition, it is possible to further suppress abnormal discharge even when a high concentration of Na is contained therein.

The method of producing a Cu—Ga alloy sputtering target according to the present invention includes a step of performing normal pressure sintering by heating a molded body formed of a powder mixture of a pure Cu powder and a Cu—Ga alloy powder in a reducing atmosphere or a step of performing normal pressure sintering by heating a molded body formed of a powder mixture of a pure Cu powder, a Cu—Ga alloy powder, and a Na compound in a reducing atmosphere, and a step of cooling the obtained sintered body at a cooling rate of 0.1° C./min to 1.0° C./min, at a temperature in a range of 450° C. to 650° C. Thus, the Cu—Ga alloy crystal particle in the sintered body has a structure in which fine γ phase particles are dispersed in a $\gamma_1$-phase crystal particle, and thus a Cu—Ga alloy sputtering target which has improved fragility and causes generation of particles during sputtering to be reduced is obtained.

BEST MODE FOR CARRYING OUT THE INVENTION

Hereinafter, a Cu—Ga alloy sputtering target according to an embodiment of the present invention, and an embodiment of a method of producing the Cu—Ga alloy sputtering target will be specifically described.

Figure 1:
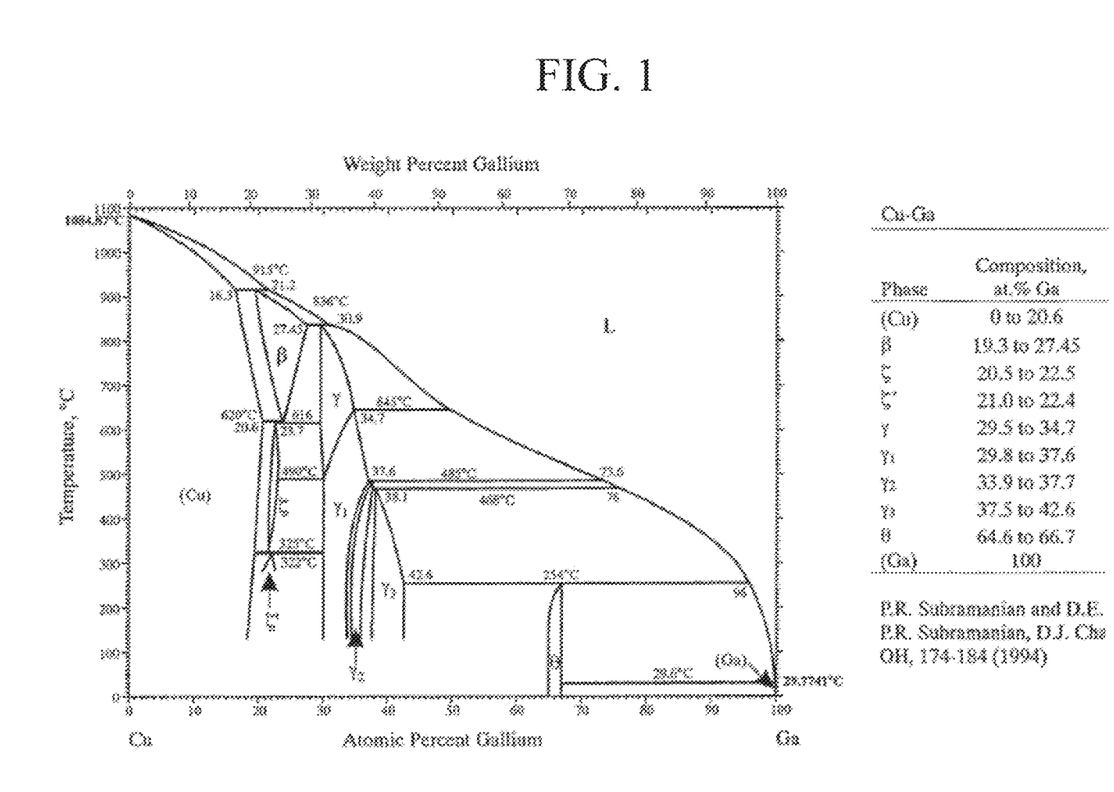
FIG. 1 shows a state diagram of Cu—Ga alloys.

A γ phase in the present invention corresponds to a γ phase (Phase-γ in which Ga is provided so as to be in a range of 29.5 atom % to 34.7 atom %) which is stable at 490° C. or higher in the state diagram which is shown in FIG. 1 and relates to Cu—Ga alloys. A $\gamma_1$ phase in the present invention corresponds to a $\gamma_1$ phase (Phase-$\gamma_1$ in which Ga is provided so as to be in a range of 29.8 atom % to 37.6 atom %) which is stable at 645° C. or lower in the state diagram.

A sintered body of the Cu—Ga alloy sputtering target according to the embodiment has a composition of Ga and a balance. Ga is contained so as to be 29.5 atom % to 43.0 atom %, and as the balance, Cu and inevitable impurities are contained. The sintered body has a structure in which a Cu—Ga alloy crystal particle is used as a parent phase (matrix phase), and the parent phase includes γ phase particles and $\gamma_1$-phase crystal particles of Cu—Ga alloy. Particularly, the parent phase has a structure in which γ phase particles of which the average particle number in a $\gamma_1$-phase crystal particle having an average particle diameter of 15.0 µm to 75.0 µm is 6 to 36 are dispersed.

In the manufacturing of a Cu—Ga alloy sputtering target, which has been proposed in PTL 1, a powder mixture of a Cu powder and a Ga powder is subjected to hot pressing, and thus a Cu—Ga alloy sintered body is obtained. Generally, the obtained sintered body is cooled from a hot pressing temperature, and thereby manufacturing a sputtering target. In this case, as known in the state diagram of the Cu—Ga alloy (source of reference, Desk Handbook: Phase Diagrams for Binary Alloys (ASM International)) in FIG. 1, the structure of the sintered body is configured by only the Cu—Ga alloy particle and the average particle diameter thereof is large. For example, in a case of Cu—Ga alloys which contains 29.5 atom % to 34.7 atom % of Ga and a balance is Cu, a Cu—Ga alloy particle in the sintered body is mainly configured by the γ phase. The γ phase originally has relatively fragile properties, and thus becomes a cause of the generation of particles and abnormal discharge during sputtering.

In the present invention, the parent phase of the Cu—Ga alloy particle is configured by two phases of the γ phase and the $\gamma_1$ phase, and thus a structure in which the fine γ phase is dispersed in the $\gamma_1$ phase which is softer than the γ phase is applied. The Cu—Ga alloy particle in the Cu—Ga alloy sputtering target has such a structure, and thus it is possible to improve fragility and to reduce the average particle diameter of a Cu—Ga alloy phase. Accordingly, it is possible to suppress the generation of particles and abnormal discharge during sputtering.

Here, in order to manufacture the Cu—Ga alloy sputtering target according to the embodiment, a molded body formed from a powder mixture of a pure Cu powder and a Cu—Ga alloy powder is heated in a reducing atmosphere. Therefore, normal pressure sintering is performed. Then, the obtained sintered body is cooled at a cooling rate of 0.1° C./min to 1.0° C./min, at a temperature having a range of 450° C. to 650° C. It has been found that a Cu—Ga alloy particle which has an organizational structure configured by the two phases of the γ phase particle and the $\gamma_1$-phase crystal particle can be formed in the sintered body if the above treatment is performed. As understood from the state diagram FIG. 1, which relates to the Cu—Ga alloys, the above-described cooling condition (cooling rate) is adjusted in the process of cooling the sintered body, and thus it is possible to change the dispersion state of the γ phase in the $\gamma_1$ crystal particle.

The change of the dispersion state of the γ phase in the $\gamma_1$ phase will be described. Firstly, because the γ phase is stable in the vicinity of a sintering temperature in the process of cooling after sintering of the molded body, if the molded body is rapidly cooled, a sintered body in which the main phase of the Cu—Ga alloy particle is the γ phase is obtained. On the contrary, if the molded body is gradually cooled, for example, at a slow cooling rate of 0.1° C./min to 1.0° C./min, at a temperature having a range of 450° C. to 650° C. in the middle of the cooling, the fine $\gamma_1$ phase in the γ phase appears. Since a percentage of the γ phase and the $\gamma_1$ phase is gradually changed in the cooling process using the slow cooling rate, if the cooling rate becomes faster at a point of time when the fine γ phase is formed in the $\gamma_1$ phase, a Cu—Ga alloy particle having a structure in which fine γ phase particles are dispersed in a $\gamma_1$-phase crystal particle can be obtained.

In the Cu—Ga alloy sputtering target according to the embodiment, the Cu—Ga alloy particle has a structure in which the γ phase particles of which an average particle number in the $\gamma_1$-phase crystal particle having an average particle diameter of 15.0 µm to 75.0 µm is 6 to 36 are dispersed. If the cooling rate is too slow, the Cu—Ga alloy particle becomes larger, and the frequency abnormal discharge is increased even when fine γ phase particles are dispersed. Thus, the average particle diameter of the $\gamma_1$-phase crystal particle is set to be equal to or less than 75.0 µm. In a case where the average particle number of the γ phase particles is less than 6, an effect of prevention of abnormal discharge is not obtained. In a case where the average particle number of the γ phase particles is more than 36, the cooling rate is required to be set to be less than 0.1° C./min. Since the $\gamma_1$ parent phase becomes coarse and the average particle diameter of the $\gamma_1$ phase is more than 75 µm under this condition, abnormal discharge is increased, sputtering is not performed well, and control of the cooling rate is difficult. The average particle diameter of the $\gamma_1$-phase crystal particles is preferably 25 µm to 50 µm and the average particle number of the γ phase particles is preferably 10 to 30. However, it is not limited thereto.

The other method of producing a Cu—Ga alloy sputtering target according to the embodiment includes a step of performing normal pressure sintering by heating a molded body formed of a powder mixture of a pure Cu powder, a Cu—Ga alloy powder, and a Na compound in a reducing atmosphere, and a step of cooling the obtained sintered body at a cooling rate of 0.1° C./min to 1.0° C./min, at a temperature having a range of 450° C. to 650° C. The above-described method of producing a Cu—Ga alloy sputtering target according to the present invention corresponds to a case of a powder mixture of the pure Cu powder and the Cu—Ga alloy powder. However, the other method of producing a Cu—Ga alloy sputtering target according to the present invention corresponds to a case of a powder mixture obtained by the Na compound being contained in the powder mixture. The cooling process is similar to the case of the above-described producing method according to the present invention. The added Na compound is confirmed to be present as a form of a Na compound phase at an interface between the Cu—Ga alloy particles in the sintered body. The preferable temperature range in the cooling process is 490° C. to 645° C., and the cooling rate is preferably 0.2° C./min to 0.9° C./min. However, it is not limited thereto.

In the producing method of a sputtering target, which is disclosed in PTL 2, Na is added to a CIG alloy. On the contrary, in the producing method according to the present invention, Na in a state of a compound is added instead of Na singleton, coarsening of the Na compound phase is suppressed, and the oxygen content of a sputtering target is restricted. In the producing method according to the present invention, the average particle diameter of the parent phase (matrix phase) of the Cu—Ga alloy in a sputtering target is optimized, and the parent phase contains the γ phase particle and the $γ_1$-phase crystal particle. Thus, a Cu—Ga alloy sputtering target which contains Na and suppresses abnormal discharge is realized.

The reason that the content of Na contained as a state of a Na compound is set to have the above range is because if the Na content exceeds 10 atom %, ensuring of sufficient sintered density is impossible and abnormal discharge in sputtering is increased. If the Na content is smaller than 0.05 atom %, the Na content of a sputter film is insufficient and obtaining a desired Na-added Cu—Ga alloy film is impossible. The Na content is preferably 1.0 atom % to 6.0 atom %, but it is not limited thereto.

The Cu—Ga alloy sputtering target according to the embodiment preferably has an oxygen content of 200 mass ppm or less. If oxygen is present in the Cu—Ga alloy sputtering target into which the Na compound is added, oxygen and the Na compound may react with each other and NaO having a high hygroscopic property is likely to be generated. Particularly, if the oxygen content exceeds 200 mass ppm, the probability of abnormal discharge in the sputtering target is high. Thus, the oxygen content is set to be equal to or less than 200 mass ppm. The lower limit value of the oxygen content may be 10 mass ppm. The oxygen content is preferably 50 mass ppm to 100 mass ppm, but is not limited thereto.

In the Cu—Ga alloy sputtering target according to the present invention, since the average particle diameter of the $γ_1$-phase crystal particles in the metal matrix is 15.0 μm to 75.0 μm, the coarse Na compound phase is not generated even though the Na compound is contained. If the average particle diameter of the $γ_1$-phase crystal particles is greater than 75.0 μm, the Na compound phase is easily coarsened. Thus, it is not preferable. If the average particle diameter of the $γ_1$-phase crystal particles is less than 15.0 μm, a fine dispersion structure for γ phase particles does not appear, and the oxygen content easily exceeds 200 mass ppm. Thus, it is not preferable.

As described above, in the Cu—Ga alloy sputtering target according to the present invention, the fine γ phase particles are dispersed in the $γ_1$-phase crystal particle, in the metal matrix. The average particle diameter of the $γ_1$-phase crystal particles is 15.0 μm to 75.0 μm. The Na compound phase having an average particle diameter which is equal to or less than 8.5 μm is finely dispersed. Since the oxygen content is equal to or less than 200 mass ppm, the oxygen content is low, and the particle diameter is small. Thus, abnormal discharge is significantly reduced.

The reason that the Ga content is equal to or greater than 29.5 atom % is because the average particle diameter of the $γ_1$-phase crystal particles is reduced and the oxygen content is easily increased if the Ga content is less than 29.5 atom %. The reason that the Ga content is equal to or less than 43.0 atom % is because if the Ga content is greater than 43.0 atom %, the percentage of the γ phase is reduced, the average particle diameter of the $γ_1$-phase crystal particles is increased, and the coarse Na compound phase is easily generated. As the Na compound, at least one of NaF, $Na_2S$, $Na_2Se$, and $Na_3AlF_6$ may be used. Here, F, S, Se, and Al which are elements other than Na in the Na compound serve as impurities in the composition of a target and are included in inevitable impurities. The Ga content is preferably 30.0 atom % to 34.7 atom %, but it is not limited thereto.

The method for producing a Cu—Ga alloy sputtering target according to the embodiment is the above-described method for producing a Cu—Ga alloy sputtering target according to the present invention. The method for producing a Cu—Ga alloy sputtering target according to the present invention includes a step of performing normal pressure sintering by heating a molded body formed from a powder mixture of a pure Cu powder, a Cu—Ga alloy powder, and a Na compound, in a reducing atmosphere. That is, in the method for producing a Cu—Ga alloy sputtering target, normal pressure sintering is performed by heating a molded body formed from a powder mixture of a pure Cu powder, a Cu—Ga alloy powder, and a Na compound, in a reducing atmosphere. Thus, mutual diffusion occurs from a raw material powder thereof during sintering in a sintered body, and the γ phase of the Cu—Ga alloy is set to a first phase. However, the sintered body is gradually cooled at a slow cooling rate of 0.1° C./min to 1.0° C./min, at a temperature having a range of 450° C. to 650° C. in the middle of the cooling. Therefore, the $γ_1$ phase appears in the γ phase. Then, the γ phase becomes finer, and the $γ_1$ phase grows on the other side. Accordingly, a crystal structure of a state where the fine γ phase particles are dispersed in the $γ_1$-phase crystal particle is obtained in the Cu—Ga alloy particle of the sintered body which has been cooled.

Figure 2:
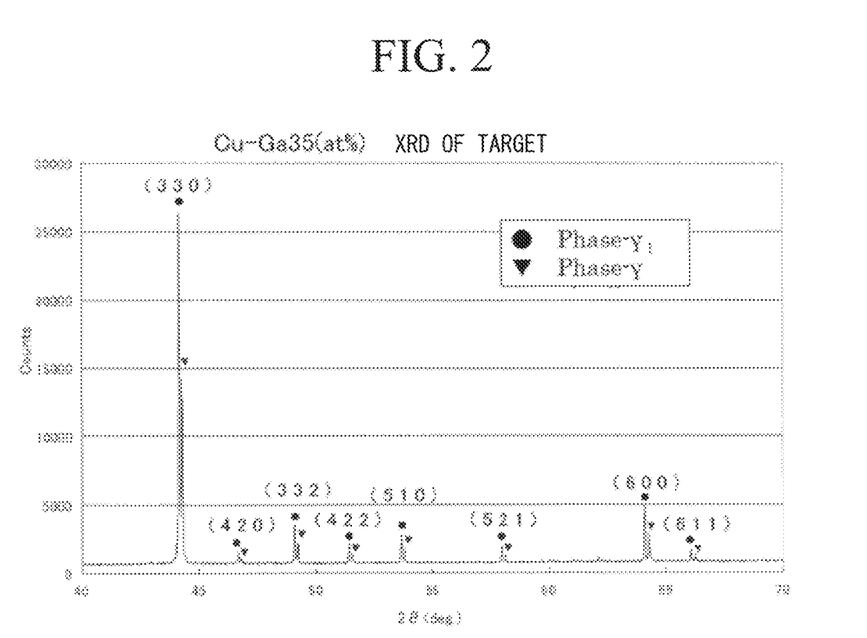
FIG. 2 is a graph showing a diffraction peak measured by X-ray diffraction, regarding a Cu—Ga alloy sputtering target containing 35.0 atom % of Ga.

Here, regarding a Cu—Ga alloy sputtering target which contains Ga so as to be 35.0 atom % as a representative example according to the present invention, FIG. 2 shows results obtained by measuring a diffraction peak through X-ray diffraction (XRD). As known from the results, both of a diffraction peak belonging to the γ phase of the Cu—Ga alloy and a diffraction peak belonging to the $γ_1$ phase thereof are observed.

Equipment and a measurement condition used in the X-ray diffraction (XRD) are as follows.

Equipment: RINT-Ultima/PC manufactured by Rigaku Denki Co., Ltd.
Bulb: Cu
Bulb voltage: 40 kV
Bulb current: 40 mA
Scanning range (2θ):40° to 70°
Slit size: diffusion (DS) ⅔ degrees, scattering (SS) ⅔ degrees, and light receiving (RS) 0.8 mm
Measurement step width: 0.02 degrees at 2θ
Scanning speed: 1 degree per minute
Number of revolutions of sample stand: 30 rpm In a case of FIG. 2, it is understood that a ratio of intensity of the diffraction peak belonging to the γ phase, and intensity of the diffraction peak belonging to the $γ_1$ phase is about 1:2 and two phases of the γ phase and the $γ_1$ phase are clearly formed in a structure.

Figure 3:
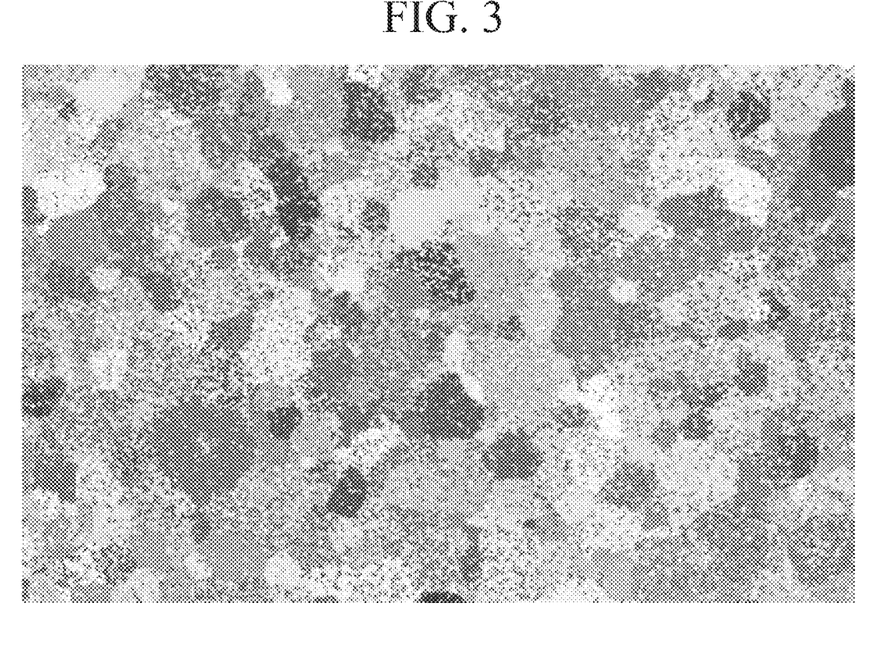
FIG. 3 is an image obtained by electron backscatter diffraction (EBSD).

FIG. 3 shows an image obtained by electron backscatter diffraction (EBSD), regarding the Cu—Ga alloy sputtering target of the representative example. An actual EBSD image is a color image in which a difference between crystal orientations relating to crystal particles is separated by color. However, in the image shown in FIG. 3, the difference is displayed by using densities of white and black in accordance with the color. Thus, an area shown by shading indicates crystal particles of the $γ_1$ phase. The main phase in a sintered body of the sputtering target may be determined to be the $γ_1$ phase which is more stable at a low temperature, based on the state diagram in FIG. 1, which relates to the Cu—Ga alloy. When observing each area shown by shading, that is, each of the Cu—Ga alloy particles of the $γ_1$ phase, it is possible to observe a form in which spot-like regions which are different from the crystal orientation of the $\gamma_1$-phase crystal particle are dispersed in each area. That is, the spot-like regions dispersed in the $\gamma_1$-phase crystal particle indicate crystal particles of the $\gamma$ phase, which are more stable at a high temperature.

It is confirmed that the Cu—Ga alloy sputtering target according to the present invention is formed from a sintered body which has a composition of Ga (29.5 atom % to 43.0 atom %) and the balance (Cu and inevitable impurities), and has a structure in which the fine $\gamma$ phase particles are dispersed in the $\gamma_1$-phase crystal particle, based on the above results.

A shape is easily held by using a pure Cu powder which is easily plastically-deformed as a raw material, when a molded body is formed. Since the pure Cu powder is oxidized in a room-temperature air, but is easily reduced by heating in the reducing atmosphere, the pure Cu powder is not the cause of an increase of the oxygen content. A liquid phase is generated in sintering and a high-density sintered body is obtained by using the Cu—Ga alloy powder of 50 atom % of Ga.

The Cu—Ga alloy sputtering target according to the embodiment includes two cases: a case of being a sintered body which has a composition with 29.5 atom % to 43.0 atom % of Ga and a balance of Cu and inevitable impurities; and a case of being a sintered body which has a composition with 29.5 atom % to 43.0 atom % of Ga, 0.05 atom % to 10.0 atom % of Na, and a balance of Cu and inevitable impurities (including elements other than Na in the Na compound). The $\gamma$ phase and the $\gamma_1$ phase of the Cu—Ga alloy are present together in each of metal matrixes of the fired bodies, and the sintered body has a structure in which fine $\gamma$ phase particles are dispersed in a $\gamma_1$-phase crystal particle. In a case where Na is contained, the sintered body has a structure in which a Na compound phase formed from at least one of NaF, $Na_2S$, $Na_2Se$, and $Na_3AlF_6$ is dispersed at a particle boundary of Cu—Ga alloy particles. In the sintered body of the Cu—Ga alloy sputtering target according to the embodiment, the main phase (parent phase) has a crystal structure of the $\gamma_1$ phase.

Figure 4:
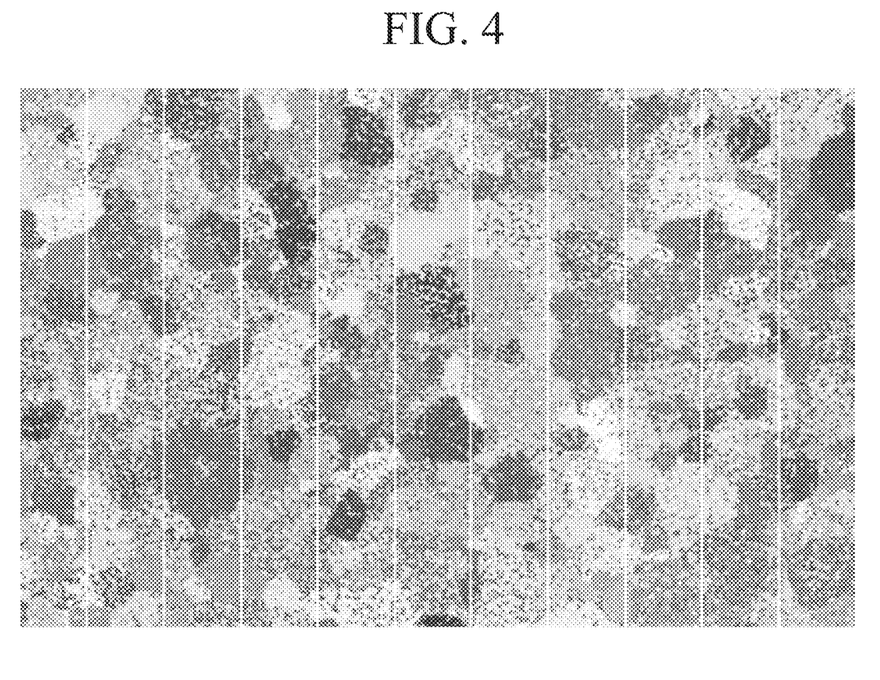
FIG. 4 is a diagram showing a method of obtaining an average particle diameter of crystal particles by using an EBSD image shown in FIG. 3.

The average particle diameter of the $\gamma_1$-phase crystal particles is obtained in the following manner. A surface of a sample cut out from the sputtering target is polished so as to become a mirror surface, and is etched by using an etchant which is formed from nitric acid and pure water. Then, a microphotograph is captured by an optical microscope which can distinguish a crystal particle boundary at a magnification of a range from 50 times to 1000 times. As shown in FIG. 4, 10 straight lines (displayed by using white lines) for dividing one side of the obtained photograph into 11 equal parts are drawn. The number of crystal particles through which the 10 straight lines pass is calculated, and the average particle diameter of the $\gamma_1$-phase crystal particles is obtained by the following calculation formula.

Average particle diameter=(value obtained by correcting lengths of the 10 straight lines on the photograph to be actual lengths)/(the number of $\gamma_1$-phase crystal particles through which the 10 straight lines pass)

The average particle number of the $\gamma$ phase particles is also obtained by using 10 straight lines of the photograph shown in FIG. 4. That is, the number of $\gamma$ phase crystal particles through which the 10 straight lines pass is calculated. A value obtained by the calculating is divided by the number of $\gamma_1$-phase crystal particles through which the 10 straight lines pass, and the average particle number thereof is obtained.

The average particle diameter of the Na compound phase may be measured based on an element distribution mapping image of Na obtained by the EPMA. In the image, a white area indicates the presence of Na and represents the size of the Na compound phase. An occupied area S ($\mu m^2$) is measured and obtained by setting this white area as one Na compound particle. The particle diameter D of the Na compound phase is obtained from an expression of particle diameter $D=(S/\pi)^{1/2}$. The average particle diameter (average value of D) and the maximum particle diameter (maximum value of D) are calculated from the number of Na compound particles which are observed in 10 square areas having one side of 100 $\mu m$, and particle diameters D.

The oxygen content is measured by an infrared absorbing method which is described in "General rules for determination of oxygen in metallic materials" of JIS Z 2613.

The method for producing a sputtering target in this embodiment has a step of performing normal pressure sintering by heating a molded body in a reducing atmosphere. The molded body is formed from a powder mixture of a pure Cu powder, a Cu—Ga alloy powder, and a Na compound.

An example of the producing method will be described in detail. First, a pure Cu powder in which D50 measured by Microtrac is 2 $\mu m$ to 3 $\mu m$ and a Cu—Ga alloy atomized powder in which D50 is 20 $\mu m$ to 30 $\mu m$ are weighed so as to be a target composition. Then, the powders are mixed with each other in an Ar atmosphere by using a Henschel mixer at a number of revolutions of 2800 rpm for 1 minute, thereby a powder mixture of the pure Cu powder and the Cu—Ga alloy atomized powder is obtained. The Cu—Ga alloy atomized powder is produced in such a manner that a Cu—Ga alloy is dissolved in a gas atomizing device so as to cause the concentration of Ga to be 50 atom %, and is atomized by using an Ar gas.

Then, a pressure powder (molded body) is obtained at a molding pressure of 500 kgf/cm$^2$ to 2000 kgf/cm$^2$ by using the obtained powder mixture. The pressure powder is arranged in a furnace. A reducing gas flows at 10 L/min to 100 L/min, and the pressure powder is heated up to a sintering temperature of 700° C. to 1000° C. at 10° C./min and is held for 5 hours. Then, cooling is performed to a temperature of 450° C. in a temperature range of 450° C. to 650° C. at a cooling rate of 0.1° C./min to 1.0° C./min, and thereby natural cooling is performed. In a cooling process from a sintering temperature to 450° C., a fine structure of the $\gamma$ phase is generated by adjusting a cooling rate to the above cooling rate. Turning processing is performed on a surface portion and an outer circumference portion of the obtained sintered body. Thereby, a sputtering target having a diameter of 50 mm and a thickness of 6 mm is manufactured.

Then, the processed sputtering target is bonded to a Cu backing plate. The Cu—Ga alloy sputtering target manufactured in this manner is provided for a direct-current (DC) magnetron sputtering device by using an Ar gas as a sputtering gas.

A Cu—Ga alloy sputtering target in a case where Na is added is produced through procedures similar to a case where Na is not added, except that a Na compound of which the weight is measured so as to obtain a desired composition is added to the powder mixture.

The Cu—Ga alloy sputtering target according to the embodiment is a sintered body which has a composition with 29.5 atom % to 43.0 atom % of Ga and a balance of Cu and inevitable impurities. The Cu—Ga alloy crystal particle in the sintered body has a structure in which $\gamma$ phase particles are dispersed in a $\gamma_1$-phase crystal particle. Particularly, the average particle number of the $\gamma$ phase particles is 6 to 36, and the average particle diameter of $\gamma_1$ phase particles is 15.0 µm to 75.0 µm. Accordingly, a structure in which fine $\gamma$ phase particles are uniformly dispersed in a $\gamma_1$ phase is formed, and thus it is possible to reduce the generation of particles and to significantly reduce abnormal discharge.

The sintered body further contains 0.05 atom % to 10.0 atom % of Na, and a Na compound phase is dispersed in the sintered body. The Na compound phase formed of at least one of NaF, $Na_2S$, $Na_2Se$, and $Na_3AlF_6$ is dispersed in the sintered body. The oxygen content is suppressed so as to be equal to or less than 200 mass ppm. Thus, it is possible to contribute to the improvement of photoelectric conversion efficiency in the light-absorbing layer of a CIGS thin-film solar cell by suppressing an increase of an amount of oxygen in a precursor film obtained through sputtering.

In the method of producing a sputtering target according to the embodiment, a molded body is formed from a powder mixture of the pure Cu powder and the Cu—Ga alloy powder, or a powder mixture of the pure Cu powder, the Cu—Ga alloy powder, and the Na compound. The normal pressure sintering is performed by heating the molded body in the reducing atmosphere, and thereby a sintered body is obtained. Then, the sintered body is cooled at a cooling rate of 0.1° C./min to 1.0° C./min, at a temperature having a range of 450° C. to 650° C. in the cooling process of the sintered body. Since the cooling rate is slower than a general cooling rate in this temperature range, as known from the state diagram of Cu—Ga series, which is shown in FIG. 1, the main phase of the Cu—Ga alloy at first is the $\gamma$ phase. However, the $\gamma_1$ phase appears in the $\gamma$ phase while the temperature becomes lower. If the temperature becomes further lowered, the $\gamma_1$ phase grows largely in the $\gamma$ phase. Here, the cooling rate is adjusted to a general rate, and thus the structure in which fine $\gamma$ phase particles are dispersed in a $\gamma_1$-phase crystal particle is maintained and cooled. In this manner, a sintered body formed from Cu—Ga alloy crystal particles which have a structure in which $\gamma$ phase particles are dispersed in a $\gamma_1$-phase crystal particle, in the sintered body is obtained.

EXAMPLE

Next, a result which is obtained by evaluating the sputtering target and the method for producing the same according to the present invention using examples manufactured based on the embodiment will be described.

Firstly, a Cu—Ga alloy atomized powder (CuGa powder in the table) having a Ga concentration of 50 atom %, a pure Cu powder, and a Na compound (NaF, $Na_2S$, $Na_2Se$, and $Na_3AlF_6$) were mixed so as to have a weight ratio as shown in Table 1, thereby powder mixtures of Examples 1 to 13 were obtained. Then, a pressure powder (molded body) was formed at a molding pressure of 1500 kgf/cm² by using each of the obtained powder mixtures. As shown in Table 2, among the powder mixtures, Examples 1 to 9 were subjected to normal pressure sintering in a hydrogen atmosphere. Examples 10 and 11 were subjected to normal pressure sintering in a carbon monoxide atmosphere. Examples 12 and 13 were subjected to normal pressure sintering in an atmosphere of an ammonia decomposition gas. The normal pressure sintering was performed by holding the powder mixture for 5 hours at a sintering temperature of 840° C. with a reducing gas flowing at 50 L/min. In the cooling process of the sintered body which was obtained after sintering, cooling was performed at a cooling rate shown in Table 2 at a temperature having a range of 450° C. to 650° C. After the temperature became lower than the temperature range, natural cooling was performed.

For comparative examples, Cu—Ga alloy atomized powder (CuGa powder in the table) being 50 atom % in concentration of Ga, a Cu powder, and a Na compound were mixed so as to have a weight ratio shown in Table 1, thereby powder mixtures of Comparative Examples 1 to 5 were obtained. In Comparative Examples 3 and 4, the Cu—Ga alloy powder was mixed so as to cause the content of Ga to be out of the range in the present invention. In Comparative Example 5, the Na compound was mixed excessively. Then, a pressure powder (molded body) was formed by using each of the obtained powder mixtures, similarly to the above examples.

As presented in Table 2, Comparative Examples 1 to 5 were subjected to normal pressure sintering in a hydrogen atmosphere, and were cooled at the cooling rate presented by Table 2 at a temperature having a range of 450° C. to 650° C. After the temperature became lower than the temperature range, natural cooling was performed. Among the comparative examples, Comparative Examples 1 and 2 had a cooling rate having a value departing from the scope of the present invention.

Table 2 shows results of composition analysis relating to Ga, Na, and Cu in sputtering targets of Examples 1 to 13 and Comparative Examples 1 to 5 in a "target composition (atom %)" field. This composition of each of the targets was measured by using an ICP method (high frequency inductively coupled plasma method).

TABLE 1

| | Raw material mixing ratio (weight %) | | | | | |
|---|---|---|---|---|---|---|
| | Cu powder | CuGa powder | NaF powder | $Na_2S$ powder | $Na_2Se$ powder | $Na_3AlF_6$ powder |
| Example 1 | 36.5 | 63.5 | — | — | — | — |
| Example 2 | 27.2 | 72.8 | — | — | — | — |
| Example 3 | 34.0 | 62.8 | 3.2 | — | — | — |
| Example 4 | 32.0 | 65.1 | — | — | — | 2.9 |
| Example 5 | 20.0 | 77.4 | 1.4 | 1.2 | — | — |
| Example 6 | 13.3 | 86.1 | 0.6 | — | — | — |
| Example 7 | 26.9 | 70.3 | 1.0 | — | 1.8 | — |
| Example 8 | 16.6 | 78.8 | — | 1.5 | — | 3.1 |
| Example 9 | 18.0 | 75.6 | 6.4 | — | — | — |
| Example 10 | 20.6 | 78.9 | — | — | — | 0.5 |
| Example 11 | 26.2 | 70.0 | 0.7 | — | — | 3.1 |
| Example 12 | 32.7 | 62.9 | 4.4 | — | — | — |
| Example 13 | 24.7 | 72.8 | — | — | 0.9 | 1.6 |
| Comparative Example 1 | 25.9 | 71.7 | 2.4 | — | — | — |
| Comparative Example 2 | 46.2 | 52.5 | — | — | — | 1.3 |
| Comparative Example 3 | 42.9 | 54.2 | 2.9 | — | — | — |
| Comparative Example 4 | 11.5 | 85.4 | — | — | — | 3.1 |
| Comparative Example 5 | 30.7 | 61.6 | 4.5 | — | — | 3.2 |

TABLE 2

| | | | Target composition (atom %) | | |
|---|---|---|---|---|---|
| | Sintering atmosphere | Cooling rate (° C./min) | Ga | Na | Cu and inevitable impurities |
| Example 1 | Hydrogen | 0.21 | 31.2 | — | Remaining |
| Example 2 | Hydrogen | 0.96 | 35.9 | — | Remaining |

TABLE 2-continued

| | | Target composition (atom %) | | | |
|---|---|---|---|---|---|
| | Sintering atmosphere | Cooling rate (° C./min) | Ga | Na | Cu and inevitable impurities |
| Example 3 | Hydrogen | 0.17 | 30.3 | 5.0 | Remaining |
| Example 4 | Hydrogen | 0.13 | 32.7 | 2.6 | Remaining |
| Example 5 | Hydrogen | 0.21 | 38.1 | 4.2 | Remaining |
| Example 6 | Hydrogen | 0.76 | 42.6 | 1.0 | Remaining |
| Example 7 | Hydrogen | 0.42 | 34.8 | 3.4 | Remaining |
| Example 8 | Hydrogen | 0.83 | 40.0 | 5.6 | Remaining |
| Example 9 | Hydrogen | 0.95 | 36.1 | 9.8 | Remaining |
| Example 10 | Carbon monoxide | 0.76 | 39.2 | 0.4 | Remaining |
| Example 11 | Carbon monoxide | 0.84 | 35.2 | 4.0 | Remaining |
| Example 12 | Ammonia decomposed gas | 0.52 | 30.2 | 6.7 | Remaining |
| Example 13 | Ammonia decomposed gas | 0.76 | 36.5 | 2.5 | Remaining |
| Comparative Example 1 | Hydrogen | 1.04 | 34.9 | 3.7 | Remaining |
| Comparative Example 2 | Hydrogen | 0.08 | 25.9 | 1.3 | Remaining |
| Comparative Example 3 | Hydrogen | 0.52 | 26.1 | 4.5 | Remaining |
| Comparative Example 4 | Hydrogen | 0.21 | 43.4 | 3.0 | Remaining |
| Comparative Example 5 | Hydrogen | 0.73 | 30.2 | 10.5 | Remaining |

In the above descriptions, regarding Cu—Ga alloy sputtering targets of Examples 1 to 13 and Comparative Examples 1 to 5, the average particle diameter of the parent phase (matrix phase), the average number of dispersed γ phase particles, and the oxygen content were measured, and the number of abnormal discharge occurring during sputtering was measured.

<Average Particle Diameter of Matrix Phase>

The average particle diameter of $\gamma_1$-phase crystal particles which correspond to the parent phase (matrix phase) was obtained in the following manner. A surface of a sample cut out from the sputtering target was polished so as to become a mirror surface, and was etched by using an etchant which is formed from nitric acid and pure water. Then, a microphotograph was captured by an optical microscope which could distinguish a crystal particle boundary at a magnification of a range from 50 times to 1000 times. As shown in FIG. 4, 10 straight lines (displayed by using white lines) for dividing one side of the obtained photograph into 11 equal parts were drawn. The number of crystal particles through which the 10 straight lines pass was calculated, and the average particle diameter of $\gamma_1$-phase crystal particles was obtained by the following calculation expression.

(Average particle diameter)=(value obtained by correcting lengths of the 10 straight lines on the photograph to be actual lengths)/(the number of $\gamma_1$-phase crystal particles through which the 10 straight lines pass)

The average particle number of dispersed γ phase particles was also obtained by using 10 straight lines of the photograph shown in FIG. 4. That is, the number of γ phase crystal particles through which the 10 straight lines pass was calculated. A value obtained by the calculating was divided by the number of $\gamma_1$-phase crystal particles through which the 10 straight lines pass, and the average particle number thereof was obtained.

Results of measurement as described above were shown in an "average particle diameter (μm) of a matrix phase" field, and an "average number (piece) of dispersed particles" field of Table 3. In a case where the γ phase was not present, a mark of "none" was indicated. In a case where measurement was not possible because the particle diameter of γ phase crystal particles is small, a mark of "unobservability" was indicated.

<Oxygen Content>

The oxygen content was measured by an infrared absorbing method which was described in "General rules for determination of oxygen amount in metallic materials" of JIS Z 2613. Results of the measurement were shown in an "oxygen amount (mass ppm)" field of Table 3.

<Number of Abnormal Discharge Occurring>

Regarding abnormal discharge during sputtering, sputtering was performed under the following film formation conditions for 12 hours and the number of abnormal discharge occurring was measured.

Power: Pulse DC500 W
Full pressure: 0.4 Pa
Sputtering gas: Ar=47.5 sccm, $O_2$=2.5 sccm
Target substrate (TS) distance: 70 mm The number of abnormal discharge occurring was measured by an accounting function of a DC power source (type number: RPDG-50A) manufactured by MKS Instruments Inc.

Results of the measurement were shown in an "abnormal discharge (times)" field of Table 3.

TABLE 3

| | Matrix phase average particle diameter (μm) | Average number of dispersed particles (piece) | Oxygen amount (mass ppm) | Abnormal discharge (times) |
|---|---|---|---|---|
| Example 1 | 74.2 | 34.3 | 110 | 0 |
| Example 2 | 29.9 | 11.5 | 120 | 0 |
| Example 3 | 56.6 | 33.2 | 170 | 0 |
| Example 4 | 47.7 | 35.1 | 120 | 0 |
| Example 5 | 39.1 | 30.8 | 100 | 0 |
| Example 6 | 33.5 | 13.2 | 70 | 0 |
| Example 7 | 40.8 | 24.2 | 80 | 0 |
| Example 8 | 30.6 | 14.4 | 60 | 0 |
| Example 9 | 20.4 | 6.9 | 180 | 0 |
| Example 10 | 31.1 | 9.5 | 110 | 0 |
| Example 11 | 28.9 | 8.1 | 90 | 0 |
| Example 12 | 31.5 | 8.6 | 170 | 0 |
| Example 13 | 29.4 | 11.7 | 110 | 0 |
| Comparative Example 1 | 11.3 | None | 90 | 2 |
| Comparative Example 2 | 81.4 | 40.1 | 210 | 3 |
| Comparative Example 3 | 25.7 | Unobservability | 120 | 3 |
| Comparative Example 4 | 43.2 | Unobservability | 60 | 5 |
| Comparative Example 5 | 8.3 | Unobservability | 330 | 8 |

According to the results shown in Table 3, the following were confirmed. That is, in any of the Cu—Ga alloy sputtering targets of Examples 1 to 13, the average particle diameter relating to the $\gamma_1$ phase of the Cu—Ga alloy was in a range of 15.0 μm to 75.0 μm, the average number of dispersed particles relating to the γ phase particle of the Cu—Ga alloy was in a range of 6 to 36. The parent phase in the Cu—Ga alloy sputtering target was configured by $\gamma_1$ phase particles, and a structure in which fine γ phase particles are dispersed in the parent phase was provided. In addition, there was no abnormal discharge during sputtering.

Further, it was also confirmed that there were cases where Na is added, but the oxygen content of the target was reduced so as to be equal to or less than 200 ppm in any of the Cu—Ga alloy sputtering targets of Examples 3 to 13.

In a case of Comparative Example 1, since the cooling rate is high, it was not confirmed that a γ phase particle was generated in the $\gamma_1$ phase particles, and abnormal discharge occurred. In a case of Comparative Example 2, since the cooling rate is excessively low, the average particle diameter of the $\gamma_1$ phase becomes greater. Even when fine γ phase particles were dispersed, abnormal discharge occurred. Since Ga was insufficient in a case of Comparative Example 3, and since Ga was excessive in a case of Comparative Example 4, a γ phase particle was small enough such that observation of the presence of γ phase particles in the $\gamma_1$ phase particle was not possible, and abnormal discharge occurred. In a case of Comparative Example 5, since Na was excessively added, dispersion of Na oxide phase caused the average particle diameter of $\gamma_1$ phase particles to be small. In addition, in the case of Comparative Example 5, the γ phase particle was small enough such that observation of the presence of γ phase particles in the $\gamma_1$ phase particle was not possible, it was not confirmed that a γ phase particle was generated in the $\gamma_1$ phase particles, and abnormal discharge occurred.

As described above, it was confirmed that the Cu—Ga alloy crystal particle in the Cu—Ga alloy sintered body of a Ga component having a high concentration according to the present invention has a structure in which fine γ phase particles were dispersed in the $\gamma_1$-phase crystal particle. It was understood that the parent phase in the Cu—Ga alloy sputtering target was configured by the $\gamma_1$ phase, and it was possible to improve fragility of the target and to reduce the generation of particles during sputtering by dispersing fine γ phase particles in the parent phase. Regarding the Cu—Ga alloy sputtering target in which the Na compound (one or more of NaF, $Na_2S$, $Na_2Se$, and $Na_3AlF_6$) phase was dispersed in the sintered body, it was also understood that the parent phase was configured by the $\gamma_1$ phase, and it was possible to improve fragility, to reduce the generation of particles during sputtering, to further reduce the oxygen content of the target, and to further suppress abnormal discharge even when Na having a high concentration is contained.

INDUSTRIAL APPLICABILITY

According to the Cu—Ga alloy sputtering target of the present invention, it is possible to reduce generation of particles, to enable further reduction of the oxygen content, and to further suppress abnormal discharge even when Na having a high concentration is contained. According to the Cu—Ga alloy sputtering target of the present invention, it is possible to contribute to the improvement of photoelectric conversion efficiency in the light-absorbing layer of a CIGS thin-film solar cell.

The invention claimed is:
1. A Cu—Ga alloy sputtering target, wherein
the Cu—Ga alloy sputtering target is a sintered body which has a composition with 29.5 atom % to 43.0 atom % of Ga and a balance of Cu, and
a Cu—Ga alloy crystal particle in the sintered body has a structure in which γ phase particles are dispersed in $\gamma_1$-phase crystal particle.

2. The Cu—Ga alloy sputtering target according to claim 1, wherein
an average number of the γ phase particles in one $\gamma_1$ crystal particle is 6 to 36, and
an average particle diameter of $\gamma_1$ phase particles is 15.0 μm to 75.0 μm.

3. The Cu—Ga alloy sputtering target according to claim 1, wherein
an amount of oxygen in the sintered body is equal to or less than 200 mass ppm.

4. The Cu—Ga alloy sputtering target according to claim 1, wherein
the sintered body further contains 0.05 atom % to 10.0 atom % of Na, and
a Na compound phase is dispersed in the sintered body.

5. The Cu—Ga alloy sputtering target according to claim 4, wherein
the Na compound phase is formed of at least one of NaF, $Na_2S$, $Na_2Se$, and $Na_3AlF_6$.

6. A method for producing the Cu—Ga alloy sputtering target according to claim 1, the method comprising:
a step of performing normal pressure sintering by heating a molded body formed of a powder mixture of a Cu powder and a Cu—Ga alloy powder in a reducing atmosphere; and
a step of cooling the obtained sintered body at a cooling rate of 0.1° C./min to 1.0° C./min, at a temperature having a range of 450° C. to 650° C.

7. A method for producing the Cu—Ga alloy sputtering target according to claim 4, the method comprising:
a step of performing normal pressure sintering by heating a molded body formed of a powder mixture of a Cu powder, a Cu—Ga alloy powder, and a Na compound in a reducing atmosphere; and
a step of cooling the obtained sintered body at a cooling rate of 0.1° C./min to 1.0° C./min, at a temperature having a range of 450° C. to 650° C.

8. The Cu—Ga alloy sputtering target according to claim 2, wherein
an amount of oxygen in the sintered body is equal to or less than 200 mass ppm.

9. The Cu—Ga alloy sputtering target according to claim 2, wherein
the sintered body further contains 0.05 atom % to 10.0 atom % of Na, and
a Na compound phase is dispersed in the sintered body.

10. The Cu—Ga alloy sputtering target according to claim 3, wherein
the sintered body further contains 0.05 atom % to 10.0 atom % of Na, and
a Na compound phase is dispersed in the sintered body.

11. The Cu—Ga alloy sputtering target according to claim 8, wherein
the sintered body further contains 0.05 atom % to 10.0 atom % of Na, and
a Na compound phase is dispersed in the sintered body.

12. The Cu—Ga alloy sputtering target according to claim 9, wherein
the Na compound phase is formed of at least one of NaF, $Na_2S$, $Na_2Se$, and $Na_3AlF_6$.

13. The Cu—Ga alloy sputtering target according to claim 10, wherein
the Na compound phase is formed of at least one of NaF, $Na_2S$, $Na_2Se$, and $Na_3AlF_6$.

14. The Cu—Ga alloy sputtering target according to claim 11, wherein
the Na compound phase is formed of at least one of NaF, $Na_2S$, $Na_2Se$, and $Na_3AlF_6$.

15. A method for producing the Cu—Ga alloy sputtering target according to claim 2, the method comprising:
- a step of performing normal pressure sintering by heating a molded body formed of a powder mixture of a Cu powder and a Cu—Ga alloy powder in a reducing atmosphere; and
- a step of cooling the obtained sintered body at a cooling rate of 0.1° C./min to 1.0° C./min, at a temperature having a range of 450° C. to 650° C.

16. A method for producing the Cu—Ga alloy sputtering target according to claim 3, the method comprising:
- a step of performing normal pressure sintering by heating a molded body formed of a powder mixture of a Cu powder and a Cu—Ga alloy powder in a reducing atmosphere; and
- a step of cooling the obtained sintered body at a cooling rate of 0.1° C./min to 1.0° C./min, at a temperature having a range of 450° C. to 650° C.

17. A method for producing the Cu—Ga alloy sputtering target according to claim 8, the method comprising:
- a step of performing normal pressure sintering by heating a molded body formed of a powder mixture of a Cu powder and a Cu—Ga alloy powder in a reducing atmosphere; and
- a step of cooling the obtained sintered body at a cooling rate of 0.1° C./min to 1.0° C./min, at a temperature having a range of 450° C. to 650° C.

18. A method for producing the Cu—Ga alloy sputtering target according to claim 5, the method comprising:
- a step of performing normal pressure sintering by heating a molded body formed of a powder mixture of a Cu powder, a Cu—Ga alloy powder, and a Na compound in a reducing atmosphere; and
- a step of cooling the obtained sintered body at a cooling rate of 0.1° C./min to 1.0° C./min, at a temperature having a range of 450° C. to 650° C.

19. A method for producing the Cu—Ga alloy sputtering target according to claim 9, the method comprising:
- a step of performing normal pressure sintering by heating a molded body formed of a powder mixture of a Cu powder, a Cu—Ga alloy powder, and a Na compound in a reducing atmosphere; and
- a step of cooling the obtained sintered body at a cooling rate of 0.1° C./min to 1.0° C./min, at a temperature having a range of 450° C. to 650° C.

20. A method for producing the Cu—Ga alloy sputtering target according to claim 10, the method comprising:
- a step of performing normal pressure sintering by heating a molded body formed of a powder mixture of a Cu powder, a Cu—Ga alloy powder, and a Na compound in a reducing atmosphere; and
- a step of cooling the obtained sintered body at a cooling rate of 0.1° C./min to 1.0° C./min, at a temperature having a range of 450° C. to 650° C.

* * * * *